United States Patent
Sun et al.

(10) Patent No.: US 11,777,166 B2
(45) Date of Patent: Oct. 3, 2023

(54) MULTI-GEAR BRIGHTNESS ADJUSTMENT CIRCUIT BOARD, MULTI-GEAR BATTERY HOLDER STRUCTURE, AND MULTI-GEAR BRIGHTNESS ADJUSTMENT ASSEMBLY

(71) Applicant: Huanic Corporation, Shaanxi (CN)

(72) Inventors: Jianhua Sun, Shaanxi (CN); Dong Wang, Shaanxi (CN); Tuan Zhang, Shaanxi (CN)

(73) Assignee: Huanic Corporation, Shaanxi (CN)

( * ) Notice: Subject to any disclaimer, the term of this patent is extended or adjusted under 35 U.S.C. 154(b) by 573 days.

(21) Appl. No.: 17/044,255

(22) PCT Filed: Mar. 16, 2019

(86) PCT No.: PCT/CN2019/078394
§ 371 (c)(1),
(2) Date: Sep. 30, 2020

(87) PCT Pub. No.: WO2019/210746
PCT Pub. Date: Nov. 7, 2019

(65) Prior Publication Data
US 2021/0028419 A1    Jan. 28, 2021

(30) Foreign Application Priority Data
May 3, 2018  (CN) .......................... 201810416897.4

(51) Int. Cl.
*H01M 50/213* (2021.01)
*H05B 45/46* (2020.01)
(Continued)

(52) U.S. Cl.
CPC ........ *H01M 50/213* (2021.01); *H01H 19/001* (2013.01); *H01H 19/10* (2013.01);
(Continued)

(58) Field of Classification Search
None
See application file for complete search history.

(56) References Cited

U.S. PATENT DOCUMENTS

| 5,493,450 A | 2/1996 | Ekstrand |
| 7,937,879 B2 | 5/2011 | Hamilton |

(Continued)

FOREIGN PATENT DOCUMENTS

| CN | 2371764 Y | 3/2000 |
| CN | 104613817 A | 5/2015 |

(Continued)

OTHER PUBLICATIONS

International Search Report in connection with International Application No. PCT/CN2019/078394, dated May 29, 2019.
(Continued)

*Primary Examiner* — Tracy M Dove
(74) *Attorney, Agent, or Firm* — Wolf, Greenfield & Sacks, P.C.

(57) ABSTRACT

A multi-gear brightness adjustment circuit board, and a multi-gear battery holder structure, which through adding the automatic control gear AUTO conductive contact piece and a light spot dot-circle pattern composite conductive contact piece on the circuit board, the gear can be automatically adjusted when the solar cell is used for power supply. Ensuring that the output light power meets the needs of ambient light, rationally use electric energy, which is conducive to energy saving; at the same time, the mode switching of the shooting target is integrated, which reduces the parts of the sight and makes the sight more compact.

13 Claims, 9 Drawing Sheets

(51) Int. Cl.
*H05B 45/10* (2020.01)
*H01H 19/00* (2006.01)
*H01H 19/10* (2006.01)
*H05K 1/11* (2006.01)
*F41G 1/34* (2006.01)
*H01H 19/54* (2006.01)

(52) U.S. Cl.
CPC .............. *H05B 45/10* (2020.01); *H05B 45/46* (2020.01); *H05K 1/117* (2013.01); *F41G 1/345* (2013.01); *H01H 19/54* (2013.01); *H01M 2220/30* (2013.01); *H05K 2201/09027* (2013.01)

(56) References Cited

U.S. PATENT DOCUMENTS

2010/0083555 A1  4/2010  Chen et al.
2017/0038177 A1  2/2017  Sun

FOREIGN PATENT DOCUMENTS

CN    108592700 A    9/2018
EP    3246655 A1     11/2017

OTHER PUBLICATIONS

Extended European Search Report dated May 28, 2021 in connection with European Application No. 19797110.4.

MULTI-GEAR BRIGHTNESS ADJUSTMENT CIRCUIT BOARD, MULTI-GEAR BATTERY HOLDER STRUCTURE, AND MULTI-GEAR BRIGHTNESS ADJUSTMENT ASSEMBLY

CROSS-REFERENCE TO RELATED APPLICATIONS

The present application claims the priority to the Chinese patent application No. 201810416897.4, filed on May 3, 2018, which is incorporated herein by reference in its entirety.

TECHNICAL FIELD

The application belongs to the technical field of gun sights, in particular to a knob brightness adjustment switch, in particular to a multi-gear brightness adjustment circuit board, a multi-gear brightness adjustment assembly, and a battery holder structure.

BACKGROUND

In order to reduce the size of the gun sight and the convenience of operation, the battery compartment and the knob switch are generally designed as a whole, and the output light energy or power is adjusted through manually adjusting the gear of the knob switch.

However, the existing rotary switch (with battery included) only has the function of manual adjustment, and cannot automatically adjust the light power according to the needs of ambient light. At the same time, the mode of the target cannot be adjusted or changed, such as cannot switching between the aiming point and the dot-circle mode, but relying on the separately disposed aiming auxiliary target mode switch button to achieve this, which is not conducive to the reduction of overall components and the convenience of operation.

SUMMARY

To achieve the above purpose, A multi-gear brightness adjustment circuit board, including a plurality of gear conductive contact pieces disposed sequentially along a circumferential direction of a top surface of a circuit board and with a gradually increased gear, where the circuit board is also disposed with an automatic control gear AUTO conductive contact piece and a light spot dot-circle pattern composite conductive contact piece disposed along the circumferential direction of the circuit board in the circumferential direction.

The automatic control gear AUTO conductive contact piece and the light spot dot-circle pattern composite conductive contact piece are sequentially disposed between an OFF gear of the gear conductive contact piece and a maximum gear MAX conductive contact piece of the gear conductive contact piece;

or the automatic control gear AUTO conductive contact piece and the light spot dot-circle pattern composite conductive contact piece are respectively disposed closely on a front and a back sides of the OFF gear.

When the automatic control gear AUTO conductive contact piece and the light spot dot-circle pattern composite conductive contact piece are respectively disposed closely on the front and back sides of the OFF gear, where the automatic control gear AUTO conductive contact piece is disposed between a 1 gear conductive contact piece of the gear conductive contact piece and the OFF gear, and the light spot dot-circle pattern composite conductive contact piece is disposed between the OFF gear and the maximum gear MAX conductive contact piece.

The top surface of the circuit board is disposed with a negative conductive contact point or piece and a positive conductive ring;

the gear conductive contact piece, the automatic control gear AUTO conductive contact piece and the light spot dot-circle pattern composite conductive contact piece are all disposed on the same circumferential gear ring surface;

the negative conductive contact point or piece, the positive conductive ring and the circumferential gear ring surface are arranged along the radial direction of the circuit board, and are respectively disposed on non-intersecting ring surfaces.

A battery holder structure including the above multi-gear brightness adjustment circuit board, where including a first pressing ring, an annular rotating cover, an annular rotating seat and a second pressing ring, a upper cover, an insulating pad, a battery, a positive toothed ring, a negative circuit board, a conductive contact piece;

the insulating pad is pressed between the upper cover and a positive of the battery;

the battery is clamped in the positive toothed ring;

the negative circuit board is disposed between a negative of the battery and the conductive contact piece;

the negative circuit board is disposed with a negative elastic piece that is pressed between the negative of the battery and the negative circuit board;

the conductive contact piece includes a positive conductive contact piece, a negative conductive contact piece and a gear switching contact piece;

the positive conductive contact piece and the negative conductive contact piece are respectively in contact with a positive conductive piece and a negative conductive piece on the circuit board;

the gear switching contact piece is used to contact any one of the gear conductive contact piece, the automatic control gear AUTO conductive contact piece, and the light spot dot-circle pattern composite conductive contact piece to realize a switching of different working states or modes;

the first pressing ring is disposed outside the positive toothed ring and presses a top surface edge of the negative circuit board from top to bottom;

the negative circuit board is suspended on a step on an inner wall of the annular rotating seat;

the second pressing ring is sleeved on a annular step at a bottom end of an outer wall of the annular rotating seat;

the annular rotating cover is sleeved on a top of the annular rotating seat and is spirally connected with the annular rotating seat;

the upper cover is threadedly connected with a upper end of an inner wall of the annular rotating seat;

the circuit board is fixed on a housing of a peripheral device.

A sealing ring is disposed between the annular rotating seat and a mounting hole on the housing.

A plurality of spherical grooves arranged in a circumferential direction are disposed on a bottom end surface of the annular rotating seat;

the housing is disposed with at least one blind hole perpendicular to the bottom end surface of the annular rotating seat, a coil spring and a steel ball are disposed in the blind hole;

the steel ball and the coil spring are sequentially disposed between the spherical groove and a bottom surface of the blind hole;

a C-shaped step is disposed on an inner side of a bottom end surface of the annular rotating seat; an annular step for mounting the circuit board is disposed on an inner side of a mounting hole on the housing, and a limit member that can be embedded in the C-shaped step is disposed on the annular step, thereby the annular rotating seat rotates clockwise and counterclockwise within a range of less than 360° relative to a plane where the mounting hole is located.

A notch recessed radially outward is disposed on a side wall of the mounting hole, and the notch is located above the annular step, and is used to cooperate with protrusions on a edge of the circuit board mounted on the annular step to realize a limit of the circuit board.

A multi-gear brightness adjustment assembly including the multi-gear brightness adjustment circuit board, where including a upper cover, an insulating pad, a battery, a positive toothed ring, a negative circuit board and a conductive contact piece;

the insulating pad is pressed between the upper cover and a positive of the battery;

the battery is clamped in the positive toothed ring;

the negative circuit board is disposed between a negative of the battery and the conductive contact piece;

the negative circuit board is disposed with a negative elastic piece that is pressed between the negative of the battery and the negative circuit board;

the conductive contact piece includes a positive conductive contact piece, a negative conductive contact piece and a gear switching contact piece;

the positive conductive contact piece and the negative conductive contact piece are respectively in contact with the positive conductive ring and the negative conductive contact point or piece on the circuit board;

the gear switching contact piece is used to contact any one of the gear conductive contact piece, the automatic control gear AUTO conductive contact piece, and the light spot dot-circle pattern composite conductive contact piece to realize a switching of different working states or modes.

The following describes the application in detail with reference to the drawings and embodiments.

DETAILED DESCRIPTION

Figure 1:
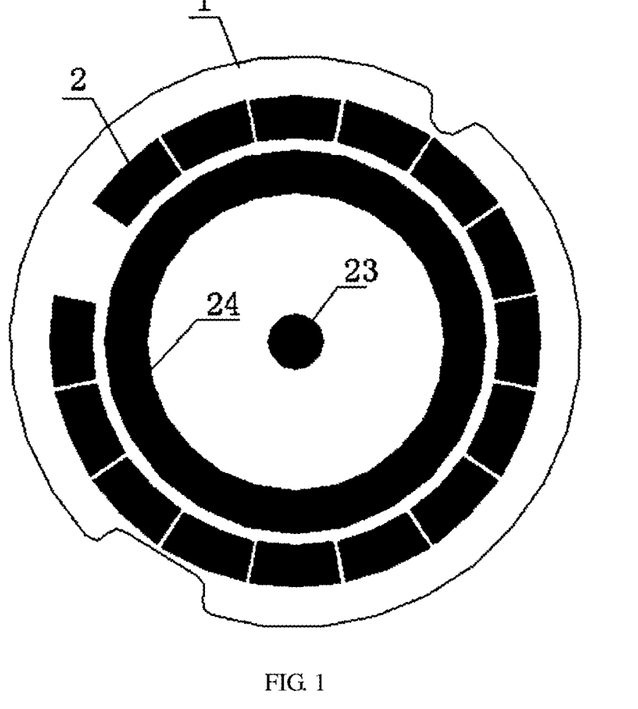
FIG. 1 is a schematic diagram of the structure of a multi-gear brightness adjustment circuit board.

FIG. 1 shows a multi-gear brightness adjustment circuit board, which includes a plurality of gear conductive contact pieces 2 disposed sequentially along the circumferential direction of the top surface of the circuit board 1 and with gradually increased gear. The difference from the existing adjustment circuit board is that the circuit board 1 is also disposed with an automatic control gear AUTO conductive contact piece 3 and a light spot dot-circle pattern composite conductive contact piece 4 disposed along the circumference of the circuit board 1 in the circumferential direction of the circuit board 1.

Figure 2:
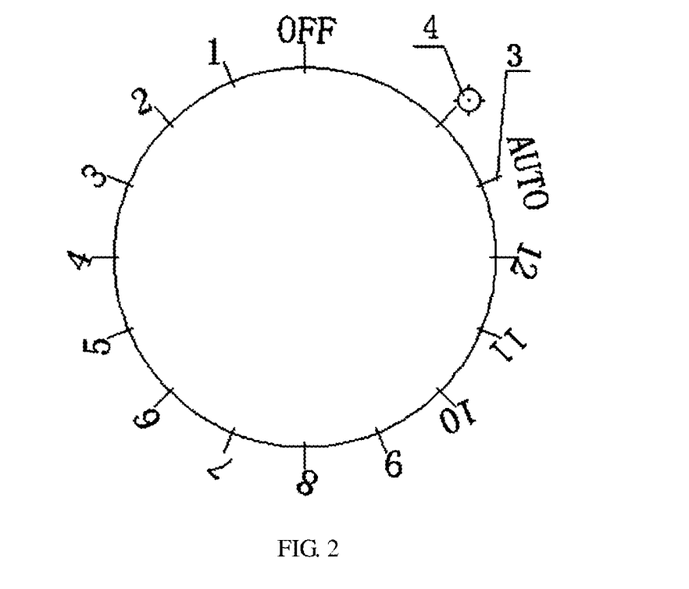
FIG. 2 is the first schematic diagram of the knob switch gear when disposing the automatic adjustment gear and target mode.

Among them, see FIG. 2 for details, the automatic control gear AUTO conductive contact piece 3 and the light spot dot-circle pattern composite conductive contact piece 4 are sequentially disposed between the OFF gear of the gear conductive contact piece 2 and the maximum gear MAX conductive contact piece of the gear conductive contact piece 2.

Figure 3:
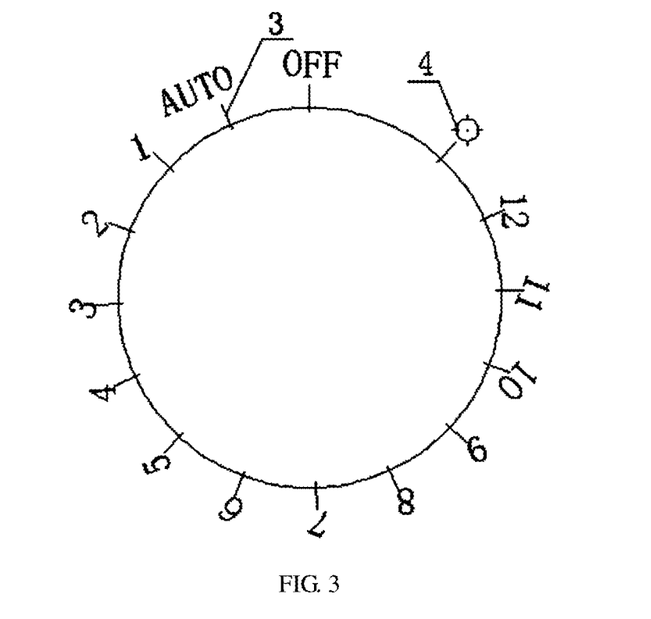
FIG. 3 is the second schematic diagram of the knob switch gear when disposing the automatic adjustment gear and target mode.

Or the automatic control gear AUTO conductive contact piece 3 and the light spot dot-circle pattern composite conductive contact piece 4 are respectively disposed closely before and after the OFF gear. As shown in FIG. 3, when the automatic control gear AUTO conductive contact piece 3 and the light spot dot-circle pattern composite conductive contact piece 4 are respectively disposed closely before and after the OFF gear, among them, the automatic control gear AUTO conductive contact piece 3 is disposed between the 1 gear conductive contact piece of the gear conductive contact piece 2 and the OFF gear, and the light spot dot-circle pattern composite conductive contact piece 4 is disposed between the OFF gear and the maximum gear MAX conductive contact piece.

The top surface of the circuit board 1 is disposed with a negative conductive contact point or piece 23 and a positive conductive ring 24. The gear conductive contact pieces 2, automatic control gear AUTO conductive contact piece 3 and light spot dot-circle pattern composite conductive contact piece 4 are all disposed on the same circumferential gear ring surface; The negative conductive contact point or piece 23, the positive conductive ring 24 and the circumferential gear ring surface are disposed along the radial direction of the circuit board 1, and are respectively disposed on non-intersecting ring surfaces.

In a specific embodiment, as shown in FIG. 1, a negative conductive contact 23 and a positive conductive ring 24 are sequentially disposed on the top surface of the circuit board 1 from the inside to the outside. The gear conductive contact piece 2, the automatic control gear AUTO conductive contact piece 3 and the light spot dot-circle pattern composite conductive contact piece 4 are all disposed outside the positive conductive ring 24. That is, the positive conductive contact piece and the negative conductive contact piece respectively contact the positive conductive ring 24 and the negative conductive contact point or piece 23 on the circuit board 1 to realize the stable contact and supply of the positive and negative of the power. Of course, the designer can exchange the positions of the negative conductive contact 23 and the positive conductive ring 24 according to the design requirements, or interchange the positions of the circumferential gear ring surface even interchange any two positions to realize various circuit structures and corresponding specific circuit designs.

In this way, the present embodiment realizes the automatic adjustment of light energy according to the environment through adding the automatic control gear AUTO and the light spot dot-circle mode, and at the same time integrates the target mode on the circuit board, which reduces the number of component parts and facilitates operation.

Figure 4:
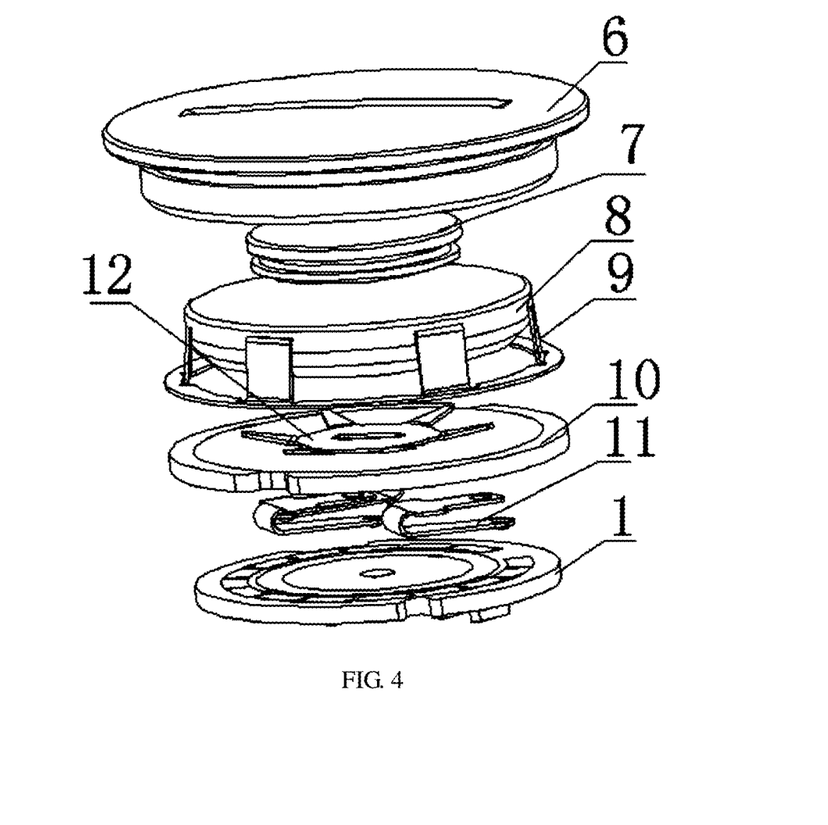
FIG. 4 is a structural disassembly diagram of a multi-gear brightness adjustment assembly.

FIG. 4 shows a multi-gear brightness adjustment assembly (partial structure of the battery holder) containing the aforementioned multi-gear brightness adjustment circuit board, including upper cover 6, insulating pad 7 (rubber pad is generally used), battery 8, positive toothed ring 9, negative circuit board 10, conductive contact piece 11; The insulating pad 7 is pressed between the upper cover 6 and the positive of the battery 8 for protection and insulation. The battery 8 is clamped in the positive toothed ring 9 to provide positive power supply, and at the same time, it is fixed and limited by the positive toothed ring 9 to ensure that the battery 8 is firmly installed and stable in use.

The negative circuit board 10 is disposed between the negative of the battery 8 and the conductive contact piece 11. The conductive contact piece 11 includes a positive conductive contact piece, a negative conductive contact piece and a gear switching contact piece. The positive conductive contact piece and the negative conductive contact piece are respectively in contact with the positive conductive piece and the negative conductive piece on the circuit board 1; The gear switching contact piece is used to contact any one of the gear conductive contact piece 2, the automatic control gear AUTO conductive contact piece 3, and the light spot dot-circle pattern composite conductive contact piece to realize the switching of different working states or modes.

Among them, the positive conductive contact piece, the negative conductive contact piece and the gear switching contact piece are in contact with any one of the positive conductive piece, negative conductive piece, the gear conductive contact piece 2, the automatic control gear AUTO conductive contact piece 3, and the light spot dot-circle pattern composite conductive contact piece respectively through the arc-shaped contact points on the bottom surface thereof to ensure the normal shift of gears while realizing the stable power.

The negative circuit board 10 is disposed with a negative elastic piece 12 that is pressed between the negative of the battery 8 and the negative circuit board 10 and pressed against the negative of the battery 8 to ensure good contact and further stabilize the battery 8.

Figure 5:
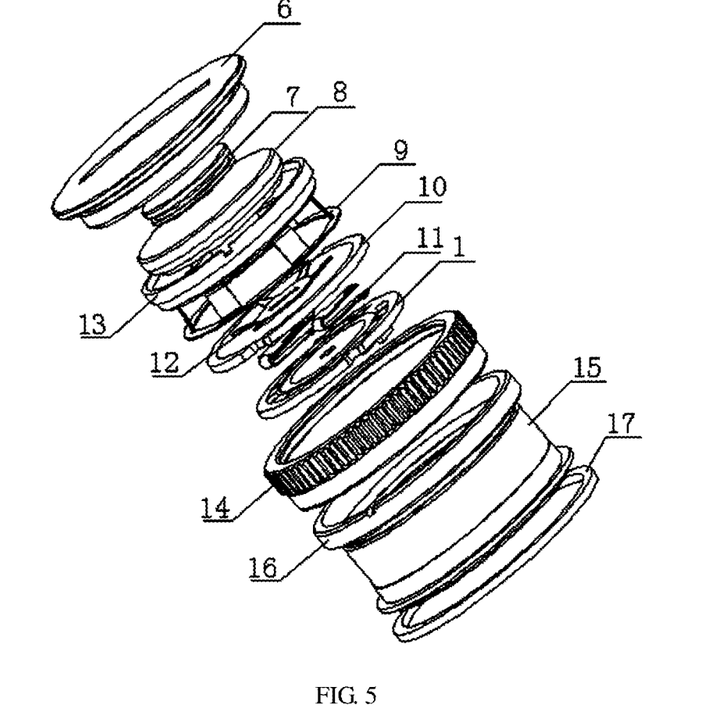
FIG. 5 is a structural disassembly diagram of the battery holder structure of the multi-gear brightness adjustment assembly.
Figure 6:
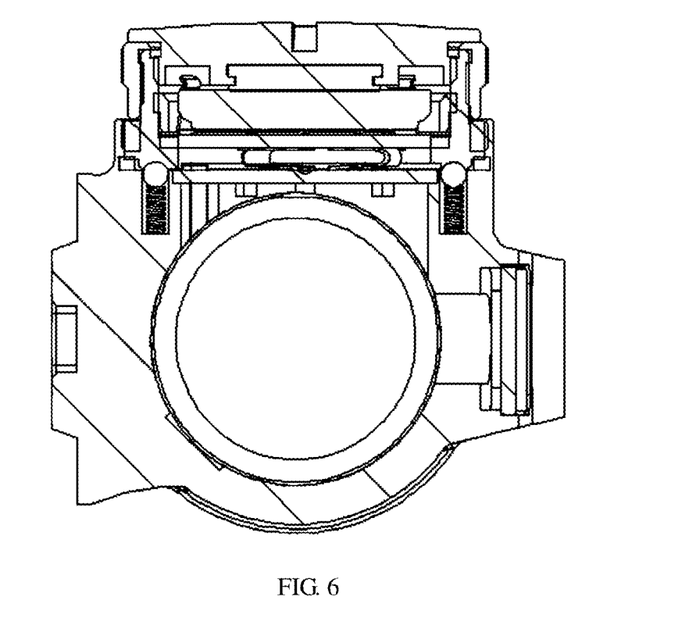
FIG. 6 is a cross-sectional view of the sight when the battery holder structure of the multi-gear brightness adjustment assembly is applied to the sight.
Figure 7:
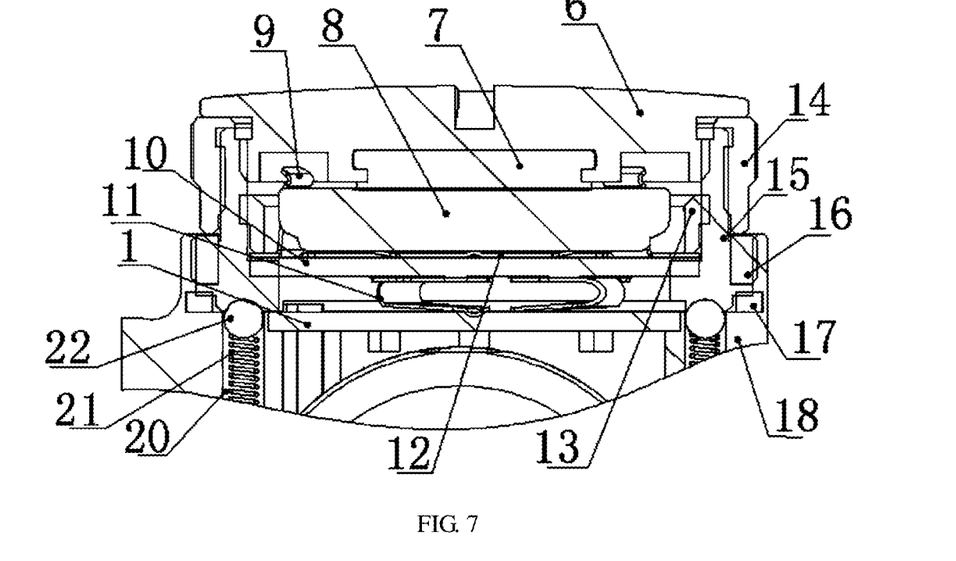
FIG. 7 is a partial enlarged view of a cross-sectional view.

FIG. 5, FIG. 6, FIG. 7 show a battery holder structure of a multi-gear brightness adjustment assembly related to the foregoing embodiment, including a first pressing ring 13, an annular rotating cover 14, an annular rotating seat 15, and a second pressing ring 16; Where, the first pressing ring 13 is disposed outside the positive toothed ring 9 and presses the top surface edge of the negative circuit board 10 from top to bottom; The negative circuit board 10 is suspended on a step on the inner wall of the annular rotating seat 15; The second pressing ring 16 is sleeved on the annular step at the bottom end of the outer wall of the annular rotating seat 15; The annular rotating cover 14 is sleeved on the top of the annular rotating seat 15 and is spirally connected with the annular rotating seat 15; The upper cover 6 is threadedly connected with the upper end of the inner wall of the rotating seat 15; The circuit board 1 is fixed on the housing 18 of the peripheral device. A sealing ring 17 is disposed between the rotating seat 15 and the installation cavity on the housing 18.

Figure 8:
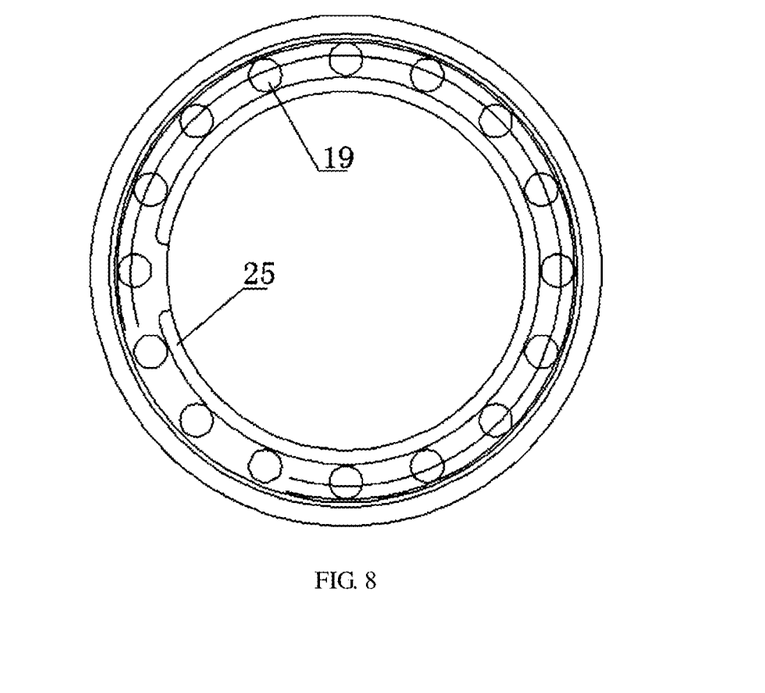
FIG. 8 is a schematic diagram of the bottom surface of the rotating seat.

As shown in FIG. 8, a plurality of spherical grooves 19 disposed in the circumferential direction are disposed on the bottom edge of the annular rotating seat 15; Correspondingly, the housing 18 is disposed with at least one blind hole 20 perpendicular to the bottom surface of the annular rotating seat 15, and a coil spring 21 and a steel ball 22 are disposed in the blind hole 20; The steel ball 22 and the coil spring 21 are sequentially disposed between the spherical groove 19 and the bottom surface of the blind hole 20, so that a sound can be made when rotating annular rotating cover drives the annular rotating seat to rotate, thereby the user can confirm that the gear adjustment is effective.

Figure 16:
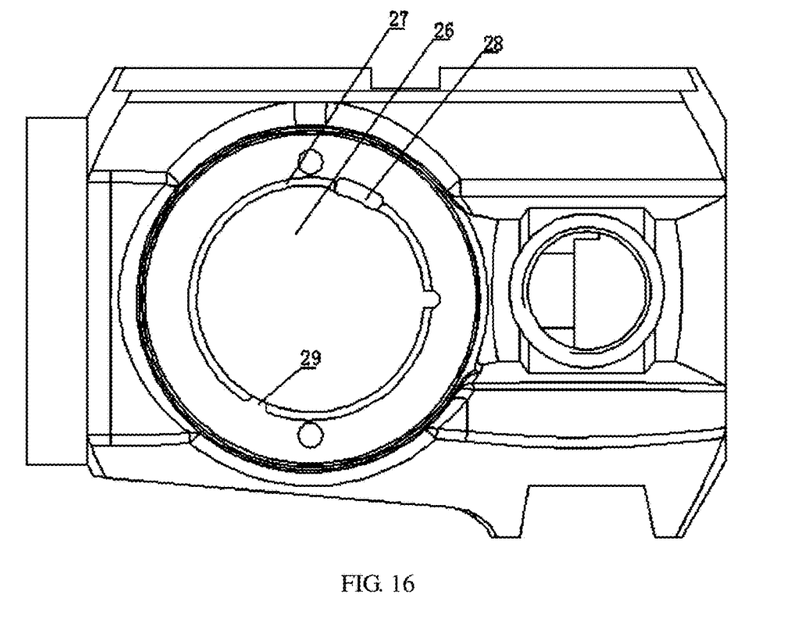
FIG. 16 is a schematic diagram when the battery holder structure is not installed on the sight.
Figure 17:
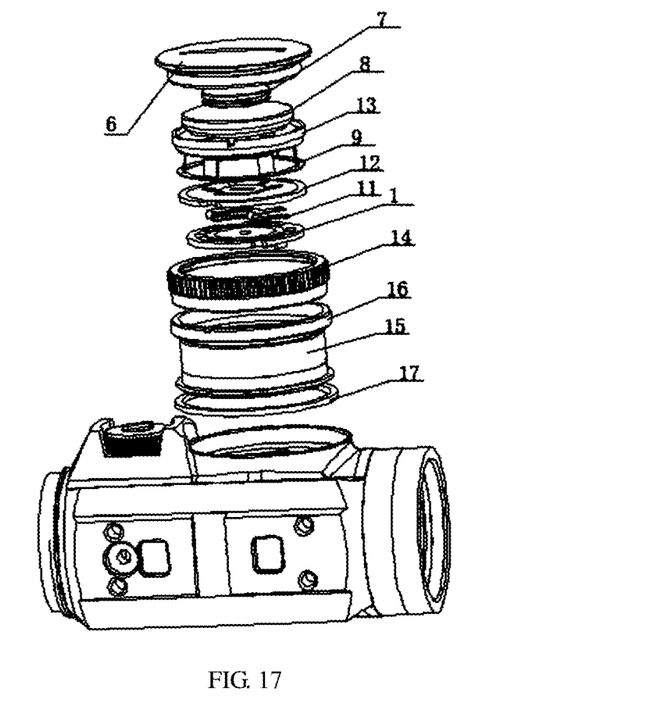
FIG. 17 is a split schematic diagram of the battery holder installed on the housing of the sight.
Figure 18:
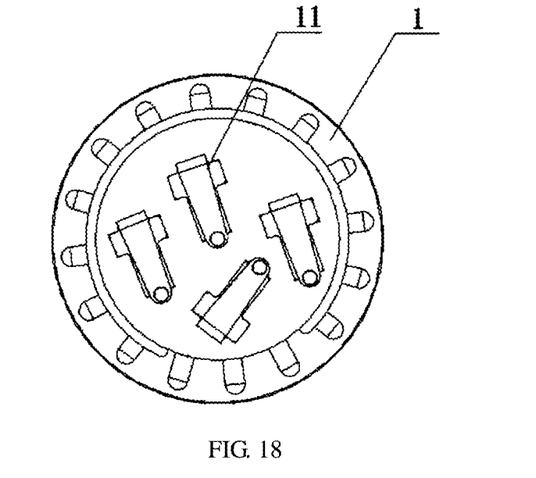
FIG. 18 is a schematic top view of the conductive contact piece when mounted on the circuit board.

It can be seen from FIG. 16 that a C-shaped step 25 is disposed on the inner side of the bottom end surface of the annular rotating seat 15; An annular step 27 for mounting the circuit board 1 is disposed on the inner side of a mounting hole 26 on the housing 18, and a limit member 28 that can be embedded in the C-shaped step 25 is disposed on the annular step 27, thereby the annular rotating seat 15 rotates positive and negative rotation (that is clockwise and counterclockwise) within a range of less than 360° relative to the plane where the mounting hole 26 is located, both of which are less than 360°.

A notch 29 recessed radially outward is disposed on the side wall of the mounting hole 26, and the notch 29 is located above the annular step 27, and is used to cooperate with the protrusions on the edge of the circuit board 1 mounted on the annular step 27 to realize the limit of the circuit board 1 to ensure the stable installation of the circuit board.

Figure 9:
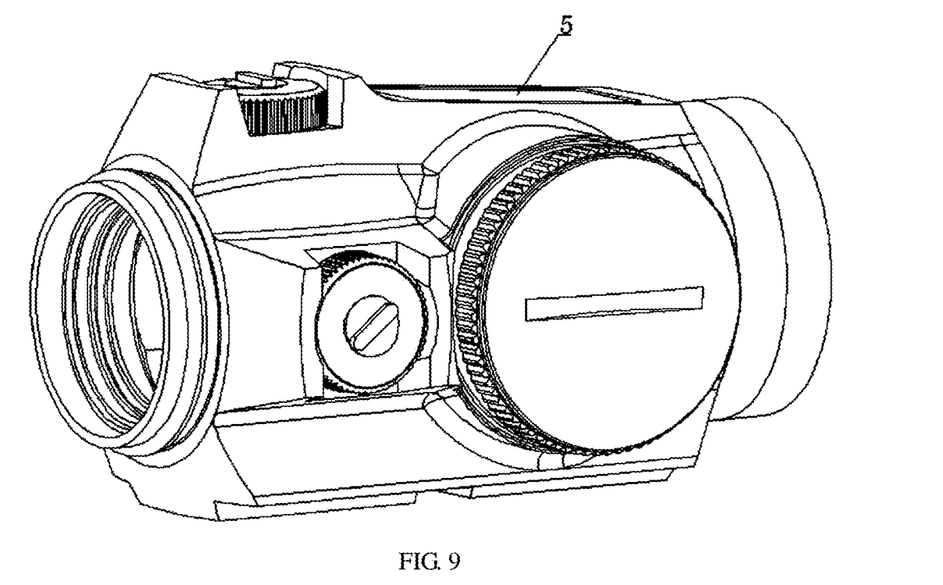
FIG. 9 is a three-dimensional schematic diagram of an inner red dot sight (a schematic diagram of the structure of the housing assembly).

FIG. 9 is a perspective view of a sight device using the battery holder structure provided by the foregoing embodiment. From this figure, it can be clearly seen that the sight device does not have a separate mode switch, which simplifies the design, reduces the cost, and improves the convenience of use. And the sight device is equipped with a solar cell 5, when using the aforementioned circuit board or battery holder structure, the circuit board 1 includes the MCU processor shown in FIG. 10, which is used to receive the ambient light signal from the PD sensor that collects ambient light and processed by the signal amplification circuit to calculate the currently required light power. The currently required light power is compared with the energy provided by the power signal from the solar cell, so as to control the battery's release of electric energy and realize the supplement of the energy of the solar cell. On the premise of ensuring that the light power meets the current needs, reduce the demand form battery power, thereby saving battery power and extending battery life.

Figure 10:
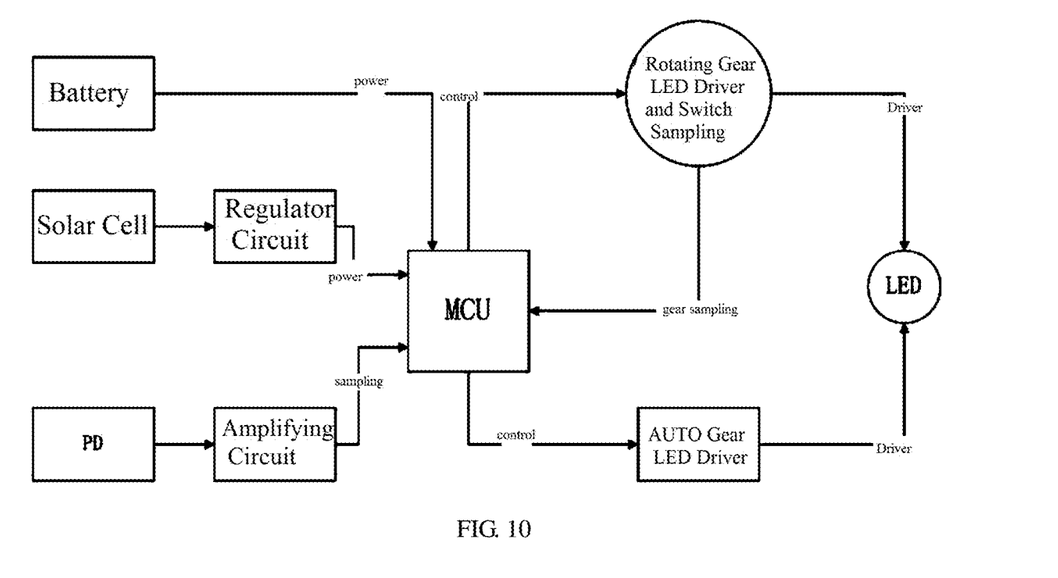
FIG. 10 is a block diagram of a circuit for realizing automatic adjustment of gears.

It can also be seen from FIG. 10, the MCU samples the signal of the gear conductive contact piece 2 of the knob switch or automatic control gear AUTO conductive contact piece 3 or the light spot dot-circle pattern composite conductive contact piece 4, in this way, it is known whether the working mode of the circuit is manual gear control mode or automatic gear control, or whether the mode of aiming at the target is photoelectric or dot-circle mode. Therefore, when the gear control mode is the automatic adjustment mode, through sampling the signal of the PD tube and the electric energy signal of the solar cell 5, when the power provided by the solar cell is sufficient, only the power is supplied by the solar cell, and when the power provided by the solar cell cannot meet the working needs, the battery is controlled to supplement the power to ensure that the light power meets the current light demand.

Figure 11:
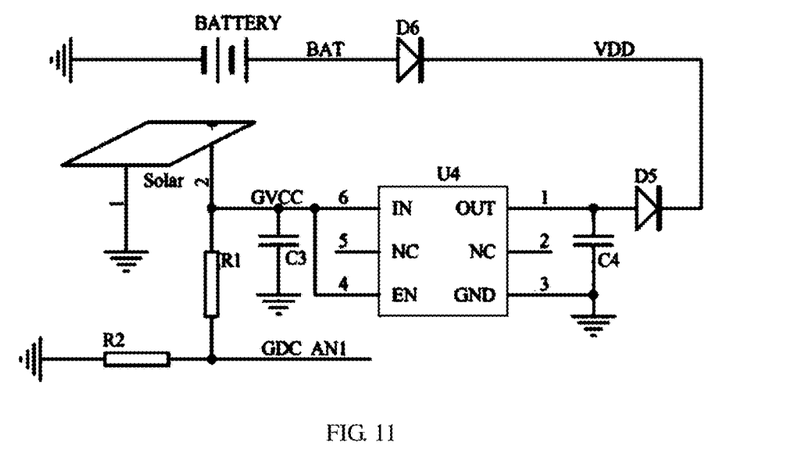
FIG. 11 is a circuit diagram of a solar cell power supply.
Figure 12:
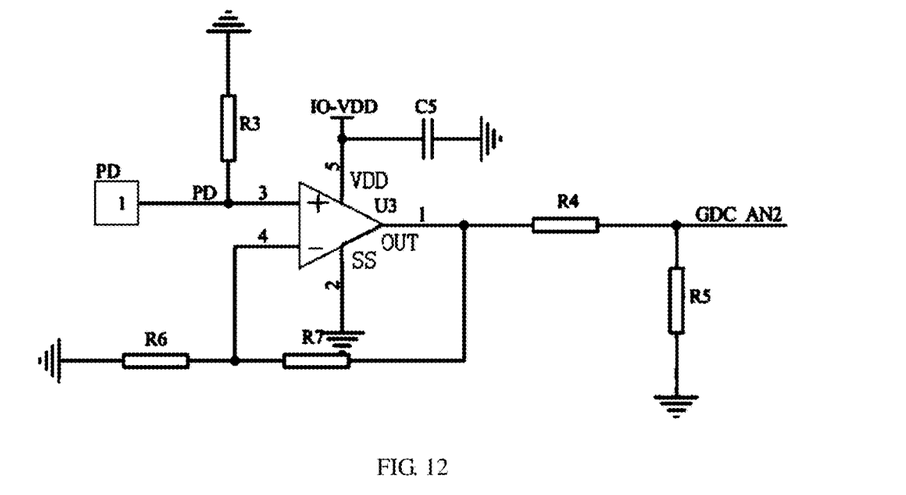
FIG. 12 is a circuit diagram of PD sensor signal amplification.
Figure 13:
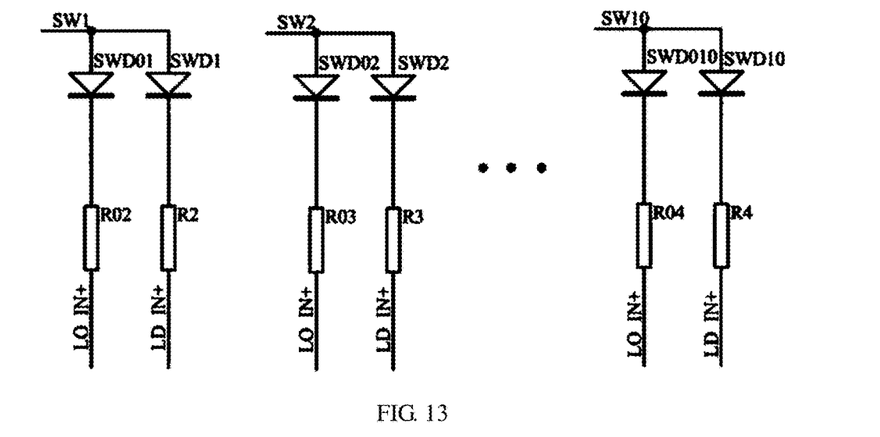
FIG. 13 is the LED drive circuit when the gear is automatically adjusted.
Figure 14:
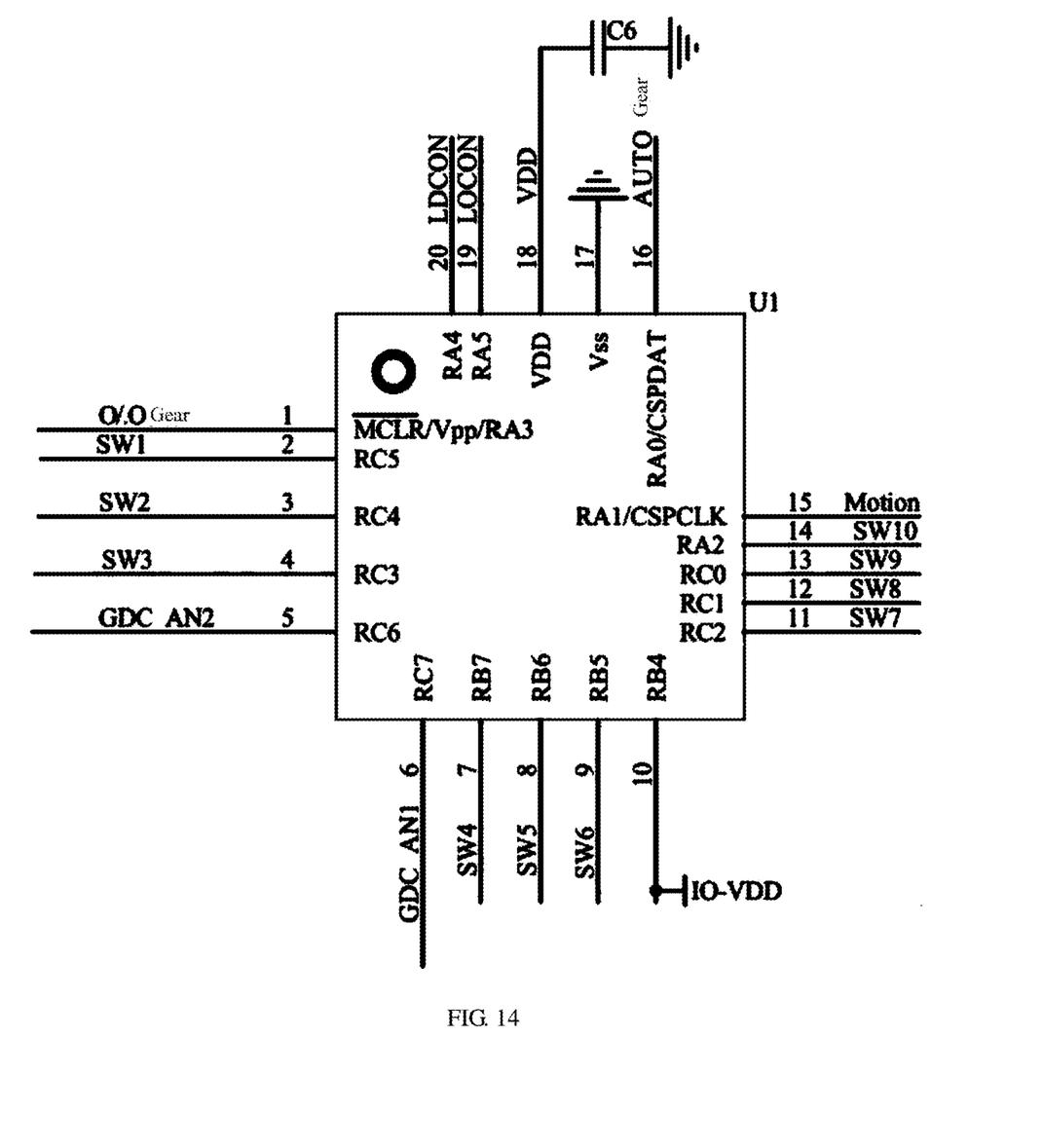
FIG. 14 is the MCU circuit diagram.
Figure 15:
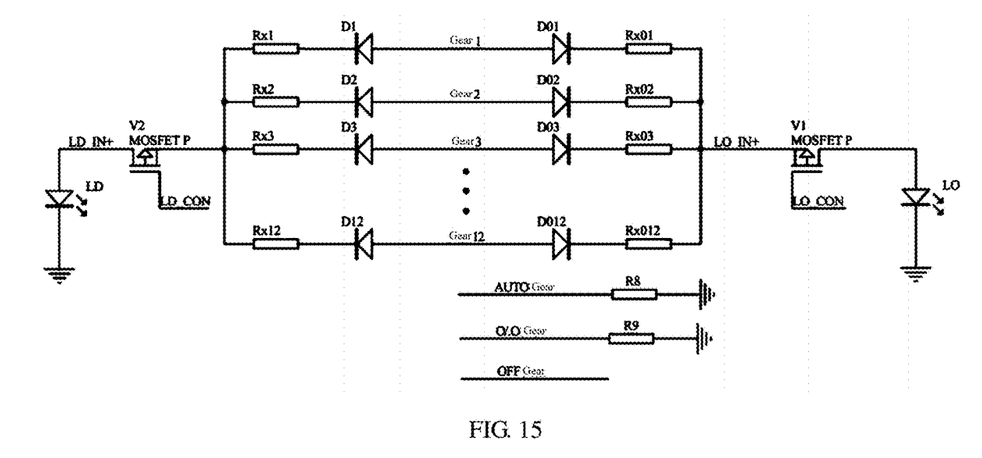
FIG. 15 is a switching circuit diagram of rotation gear detection, automatic gear and dot-circle mode.

Refer to FIG. 11 to FIG. 15 for details, FIG. 11 is a power circuit diagram of the solar cell 5. The regulated power is input to pin 6 of the MCU control chip shown in FIG. 14 through GDC_AN1, and compared with the input signal of the amplified PD sensor collected by pin 5 of the MCU control chip, if the electric energy provided by the current solar cell meets the illuminance demand in the current environment, only the solar cell will supply power, otherwise, the MCU will control the battery to provide power compensation. Of course, the prerequisite for these functions is that the MCU detects that the gear knob is in the AUTO gear.

The working process of the aforementioned circuit or the practical way of the battery holder structure can be briefly described in conjunction with FIG. 2 to describe its working process or way of use, that is, turning the gear switch to the OFF gear to turn off all functions; When the gear switch is turned to any of the gears 1, 2 . . . 12, the LED light source in the inner red dot sight is adjusted to the corresponding gear brightness; When the gear switch is turned to AUTO gear, when the MCU samples the level change of this gear through its 16 pin, the control mode enters the automatic mode. At this time, the LED light source is in the state of automatically adjusting the brightness. According to the ambient light brightness of the target obtained by the PD sampling near the chip, through collecting the power generated by the solar cell to control whether the battery is powered and provides power. Thus, the brightness of the LED light source is adjusted, so that the brightness of the LED light source can be automatically adjusted to a brightness that is convenient for observing the target.

When the gear switch is turned to ◇ (that is the light spot dot-circle composite gear), when the MCU samples the level change of this gear, it will change the LED icons in the other gears. For example, when the gear turns to the AUTO gear, the state of the inner red dot is a single point; When it turns to ◇ gear first, and then reversely turns to AUTO gear, the inner red dot state becomes dot+circle (that is dot-circle) state, that is, the target is composed of a circle and the center of the circle or a cross target.

What is claimed is:

1. A multi-gear brightness adjustment circuit board, comprising a plurality of gear conductive contact pieces disposed sequentially along a circumferential direction of a top surface of a circuit board and with gradually increased gear, wherein the circuit board is also disposed with an automatic control gear AUTO conductive contact piece and a light spot dot-circle pattern composite conductive contact piece disposed along the circumferential direction of the circuit board in the circumferential direction.

2. The multi-gear brightness adjustment circuit board of claim 1, wherein the automatic control gear AUTO conductive contact piece and the light spot dot-circle pattern composite conductive contact piece are sequentially disposed between an OFF gear of the gear conductive contact piece and a maximum gear MAX conductive contact piece of the gear conductive contact piece;

or the automatic control gear AUTO conductive contact piece and the light spot dot-circle pattern composite conductive contact piece are respectively disposed closely on a front and a back sides of the OFF gear.

3. The multi-gear brightness adjustment circuit board of claim 2, wherein when the automatic control gear AUTO conductive contact piece and the light spot dot-circle pattern composite conductive contact piece are respectively disposed closely on the front and back sides of the OFF gear, wherein the automatic control gear AUTO conductive contact piece is disposed between a 1 gear conductive contact piece of the gear conductive contact piece and the OFF gear, and the light spot dot-circle pattern composite conductive contact piece disposed between the OFF gear and the maximum gear MAX conductive contact piece.

4. The multi-gear brightness adjustment circuit board according to claim 1, wherein the top surface of the circuit board is disposed with a negative conductive contact point or piece and a positive conductive ring;

the gear conductive contact piece, the automatic control gear AUTO conductive contact piece and the light spot dot-circle pattern composite conductive contact piece are all disposed on the same circumferential gear ring surface;

the negative conductive contact point or piece, the positive conductive ring and the circumferential gear ring surface are arranged along the radial direction of the circuit board, and are respectively disposed on non-intersecting ring surfaces.

5. A battery holder structure comprising the multi-gear brightness adjustment circuit board of claim 1, wherein comprising a upper cover, an insulating pad, a battery, a positive toothed ring, a negative circuit board, a conductive contact piece, a first pressing ring, an annular rotating cover, an annular rotating seat and a second pressing ring;

the insulating pad is pressed between the upper cover and a positive of the battery;

the battery is clamped in the positive toothed ring;

the negative circuit board is disposed between a negative of the battery and the conductive contact piece;

the negative circuit board is disposed with a negative elastic piece that is pressed between the negative of the battery and the negative circuit board;

the conductive contact piece comprises a positive conductive contact piece, a negative conductive contact piece and a gear switching contact piece;

the positive conductive contact piece and the negative conductive contact piece are respectively in contact with a positive conductive piece and a negative conductive piece on the circuit board;

the gear switching contact piece is used to contact any one of the gear conductive contact piece, the automatic control gear AUTO conductive contact piece, and the light spot dot-circle pattern composite conductive contact piece to realize a switching of different working states or modes;

the first pressing ring is disposed outside the positive toothed ring and presses a top surface edge of the negative circuit board from top to bottom;

the negative circuit board is suspended on a step on an inner wall of the annular rotating seat;

the second pressing ring is sleeved on a annular step at a bottom end of an outer wall of the annular rotating seat;

the annular rotating cover is sleeved on a top of the annular rotating seat and is spirally connected with the annular rotating seat;

the upper cover is threadedly connected with a upper end of an inner wall of the annular rotating seat;

the circuit board is fixed on a housing of a peripheral device.

6. The battery holder structure of claim 5, wherein a sealing ring is disposed between the annular rotating seat and a mounting hole on the housing.

7. The battery holder structure of claim 5, wherein a plurality of spherical grooves arranged in a circumferential direction are disposed on a bottom end surface of the annular rotating seat;

the housing is disposed with at least one blind hole perpendicular to the bottom end surface of the annular rotating seat, a coil spring and a steel ball are disposed in the blind hole;

the steel ball and the coil spring are sequentially disposed between the spherical groove and a bottom surface of the blind hole;

a C-shaped step is disposed on an inner side of a bottom end surface of the annular rotating seat; an annular step for mounting the circuit board is disposed on an inner side of a mounting hole on the housing, and a limit member that can be embedded in the C-shaped step is disposed on the annular step, thereby the annular rotating seat rotates clockwise and counterclockwise within a range of less than 360° relative to a plane where the mounting hole is located.

8. The battery holder structure of claim 7, wherein a notch recessed radially outward is disposed on a side wall of the mounting hole, and the notch is located above the annular step, and is used to cooperate with protrusions an edge of the circuit board mounted on the annular step to realize a limit of the circuit board.

9. A multi-gear brightness adjustment assembly comprising the multi-gear brightness adjustment circuit board of claim 4, wherein comprising a upper cover, an insulating pad, a battery, a positive toothed ring, a negative circuit board and a conductive contact piece;

the insulating pad is pressed between the upper cover and a positive of the battery;

the battery is clamped in the positive toothed ring;

the negative circuit board is disposed between a negative of the battery and the conductive contact piece;

the negative circuit board is disposed with a negative elastic piece that is pressed between the negative of the battery and the negative circuit board;

the conductive contact piece comprises a positive conductive contact piece, a negative conductive contact piece and a gear switching contact piece;

the positive conductive contact piece and the negative conductive contact piece are respectively in contact with the positive conductive ring and the negative conductive contact point or piece on the circuit board;

the gear switching contact piece is used to contact any one of the gear conductive contact piece, the automatic control gear AUTO conductive contact piece, and the light spot dot-circle pattern composite conductive contact piece to realize a switching of different working states or modes.

10. The multi-gear brightness adjustment circuit board according to claim 2, wherein the top surface of the circuit board s disposed with a negative conductive contact point or piece and a positive conductive ring;

the gear conductive contact piece, the automatic control gear AUTO conductive contact piece and the light spot dot-circle pattern composite conductive contact piece are all disposed on the same circumferential gear ring surface;

the negative conductive contact point or piece, the positive conductive ring and the circumferential gear ring surface are arranged along the radial direction of the circuit board, and are respectively disposed on non-intersecting ring surfaces.

11. The multi-gear brightness adjustment circuit board according to claim 3, wherein the top surface of the circuit board s disposed with a negative conductive contact point or piece and a positive conductive ring;

the gear conductive contact piece, the automatic control gear AUTO conductive contact piece and the light spot dot-circle pattern composite conductive contact piece are all disposed on the same circumferential gear ring surface;

the negative conductive contact point or piece, the positive conductive ring and the circumferential gear ring surface are arranged along the radial direction of the circuit board, and are respectively disposed on non-intersecting ring surfaces.

12. A battery holder structure comprising the multi-gear brightness adjustment circuit board of claim 2, wherein comprising a upper cover, an insulating pad, a battery, a positive toothed ring, a negative circuit board, a conductive contact piece, a first pressing ring, an annular rotating cover, an annular rotating seat and a second pressing ring;

the insulating pad is pressed between the upper cover and a positive of the battery;

the battery is clamped in the positive toothed ring;

the negative circuit board is disposed between a negative of the battery and the conductive contact piece;

the negative circuit board is disposed with a negative elastic piece that is pressed between the negative of the battery and the negative circuit board;

the conductive contact piece comprises a positive conductive contact piece, a negative conductive contact piece and a gear switching contact piece;

the positive conductive contact piece and the negative conductive contact piece are respectively in contact with a positive conductive piece and a negative conductive piece on the circuit board;

the gear switching contact piece is used to contact any one of the gear conductive contact piece, the automatic control gear AUTO conductive contact piece, and the light spot dot-circle pattern composite conductive contact piece to realize a switching of different working states or modes;

the first pressing ring is disposed outside the positive toothed ring and presses a top surface edge of the negative circuit board from top to bottom;

the negative circuit board is suspended on a step on an inner wall of the annular rotating seat;

the second pressing ring is sleeved on a annular step at a bottom end of an outer wall of the annular rotating seat;

the annular rotating cover is sleeved on a top of the annular rotating seat and is spirally connected with the annular rotating seat;

the upper cover is threadedly connected with a upper end of an inner wall of the annular rotating seat;

the circuit board is fixed on a housing of a peripheral device.

13. A battery holder structure comprising the multi-gear brightness adjustment circuit board of claim 3, wherein comprising a upper cover, an insulating pad, a battery, a positive toothed ring, a negative circuit board, a conductive contact piece, a first pressing ring, an annular rotating cover, an annular rotating seat and a second pressing ring;

the insulating pad is pressed between the upper cover and a positive of the battery;

the battery is clamped in the positive toothed ring;

the negative circuit board is disposed between a negative of the battery and the conductive contact piece;

the negative circuit board is disposed with a negative elastic piece that is pressed between the negative of the battery and the negative circuit board;

the conductive contact piece comprises a positive conductive contact piece, a negative conductive contact piece and a gear switching contact piece;

the positive conductive contact piece and the negative conductive contact piece are respectively in contact with a positive conductive piece and a negative conductive piece on the circuit board;

the gear switching contact piece is used to contact any one of the gear conductive contact piece, the automatic control gear AUTO conductive contact piece, and the light spot dot-circle pattern composite conductive contact piece to realize a switching of different working states or modes;

the first pressing ring is disposed outside the positive toothed ring and presses a top surface edge of the negative circuit board from top to bottom;

the negative circuit board is suspended on a step on an inner wall of the annular rotating seat;

the second pressing ring is sleeved on a annular step at a bottom end of an outer wall of the annular rotating seat;

the annular rotating cover is sleeved on a top of the annular rotating seat and is spirally connected with the annular rotating seat;

the upper cover is threadedly connected with a upper end of an inner wall of the annular rotating seat;

the circuit board is fixed on a housing of a peripheral device.

* * * * *